(12) United States Patent
Negishi

(10) Patent No.: US 8,779,435 B2
(45) Date of Patent: Jul. 15, 2014

(54) SEMICONDUCTOR DEVICE STRUCTURE AND METHOD OF MANUFACTURING SEMICONDUCTOR DEVICE STRUCTURE

(75) Inventor: Masato Negishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/271,704

(22) Filed: Oct. 12, 2011

(65) Prior Publication Data

US 2012/0187449 A1 Jul. 26, 2012

(30) Foreign Application Priority Data

Jan. 25, 2011 (JP) ................................. 2011-012764

(51) Int. Cl.
*H01L 29/04* (2006.01)
*H01L 31/036* (2006.01)

(52) U.S. Cl.
USPC ............. 257/72; 257/396; 257/200; 257/201; 257/E21.006; 257/E21.085; 257/E21.126; 257/E21.267; 257/E21.278; 257/E21.293; 257/E21.32; 257/E21.545; 257/E21.546

(58) Field of Classification Search
USPC .............. 438/68, 462; 257/72, 347, 396, 127, 257/200, 201, 289, 649
See application file for complete search history.

(56) References Cited

U.S. PATENT DOCUMENTS

| | | | |
|---|---|---|---|
| 5,436,196 A * | 7/1995 | Miyashita ........................ 438/33 |
| 6,430,203 B1 | 8/2002 | Yokouchi et al. |
| 6,593,602 B2 | 7/2003 | Liang et al. |
| 6,660,550 B2 | 12/2003 | Sato |
| 8,258,061 B2 * | 9/2012 | Iguchi et al. ................... 438/689 |
| 2006/0246688 A1 * | 11/2006 | Sekiguchi et al. ............. 438/458 |
| 2008/0188078 A1 * | 8/2008 | Iguchi et al. ................... 438/689 |
| 2009/0137098 A1 | 5/2009 | Sakamoto et al. |
| 2009/0160035 A1 * | 6/2009 | Suzuki et al. .................. 257/623 |
| 2009/0283127 A1 * | 11/2009 | Juso et al. ...................... 136/244 |
| 2010/0329297 A1 * | 12/2010 | Rumpler et al. ............ 372/50.22 |

FOREIGN PATENT DOCUMENTS

| | | |
|---|---|---|
| JP | 3-16119 A | 1/1991 |
| JP | 8-64906 A | 3/1996 |
| JP | 9-83081 A | 3/1997 |
| JP | 10-135561 A | 5/1998 |
| JP | 2000-133877 | 5/2000 |
| JP | 2002-076432 | 3/2002 |

(Continued)

OTHER PUBLICATIONS

Japanese Patent Office; Japanese Office Action in corresponding Japanese Patent Application (Dec. 3, 2013).

(Continued)

*Primary Examiner* — David Nhu
(74) *Attorney, Agent, or Firm* — Leydig, Voit & Mayer, Ltd

(57) ABSTRACT

A semiconductor wafer has a plurality of optical semiconductor devices (namely, semiconductor lasers) which are formed from epitaxially grown layers and arranged across the surface of the semiconductor wafer. The InGaAs epitaxial layer of the semiconductor wafer has an opening (or groove) which continuously extends along and between the plurality of optical semiconductor devices, and which exposes the layer underlying the InGaAs epitaxial layer to at least the layer overlying the InGaAs epitaxial layer. The semiconductor wafer may be scribed along this opening to form a vertically extending crack therein.

8 Claims, 7 Drawing Sheets

(56) References Cited

FOREIGN PATENT DOCUMENTS

| | | |
|---|---|---|
| JP | 2002-299761 A | 10/2002 |
| JP | 2003-86900 A | 3/2003 |
| JP | 2009-117494 A | 5/2009 |
| JP | 2009-290122 A | 12/2009 |
| WO | WO 2008/111477 A1 | 9/2008 |

OTHER PUBLICATIONS

Japanese Patent Office; Office Action in Japanese Patent Application No. 2011-244595 (Jul. 9, 2013).

English language translation of Japanese Office Action (May 20, 2011).

State Intellectual Property of the People's Republic of China, Office Action in Chinese Patent Application No. 201210020283.7.

* cited by examiner

Fig. 4A
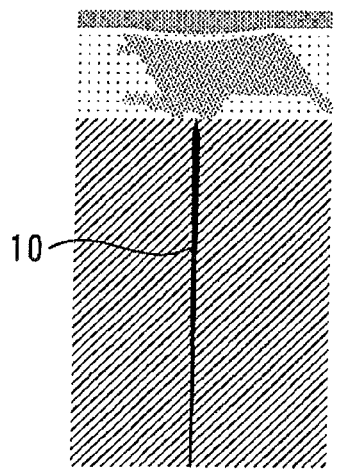
Fig. 4B
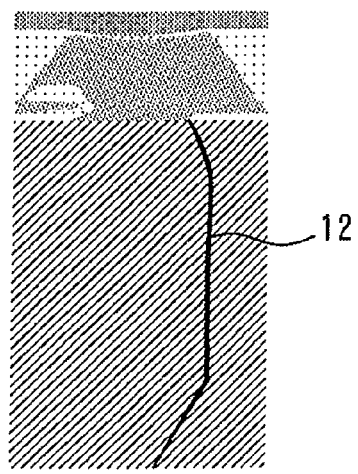
Fig. 5
| Crack forming N=5 | Scribing load and speed | | |
|---|---|---|---|
| | 6gf | 8gf | 10gf |
| | 50um/s | 50um/s | 50um/s |
| Vertically extending | 4 | 1 | 0 |
| Vertically then obliquely extending | 1 | 4 | 5 |

Fig. 15
| Crack forming | Scribing load and speed | | |
|---|---|---|---|
| | 6gf 50um/s | 8gf 50um/s | 10gf 50um/s |
| Vertically extending | 0 | 0 | 0 |
| Vertically then obliquely extending | 0 | 4 | 4 |
| Obliquely extending | 2 | 0 | 0 |
| Not formed | 3 | 1 | 1 |
Fig. 16
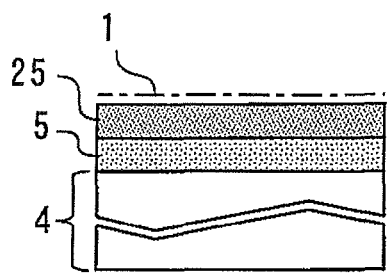
Fig. 17
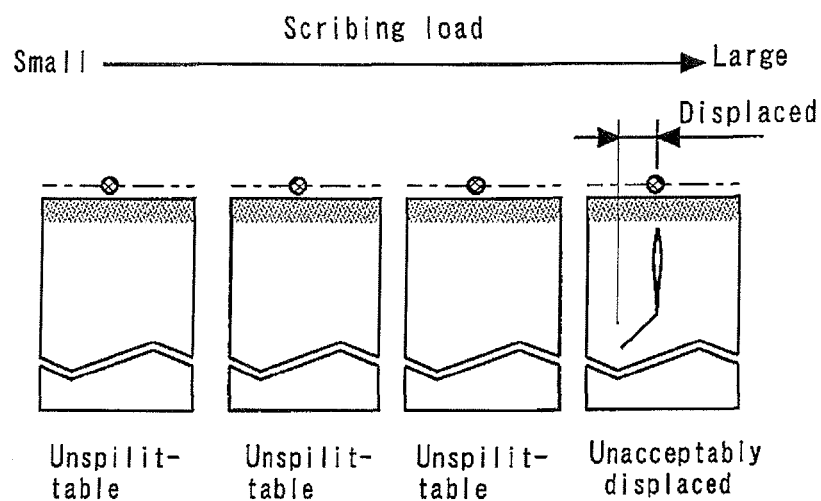

SEMICONDUCTOR DEVICE STRUCTURE AND METHOD OF MANUFACTURING SEMICONDUCTOR DEVICE STRUCTURE

FIELD OF THE INVENTION

The present invention relates to a semiconductor wafer, a semiconductor bar, a method of manufacturing a semiconductor wafer, a method of manufacturing a semiconductor bar, and a method of manufacturing a semiconductor device.

BACKGROUND ART

Semiconductor wafer manufacturing techniques for providing a groove or a specific structure in a semiconductor wafer to accomplish various purposes have been known, as described, e.g., in Japanese Laid-Open Patent Publication Nos. H03-16119, 2002-299761, and 2009-117494. For example, a technique is known for providing a trench in the heteroepitaxial layer on a semiconductor substrate in such a manner that the trench encloses each chip, as described in the above publication No. H03-16119. This trench prevents crystal defects in the epitaxial layer from propagating into the chips even when stress is induced during various manufacturing processes of the semiconductor device. Further, there is known a technique for forming a semiconductor separation layer in a predetermined pattern on the boundary regions between semiconductor chips, as described, e.g., in the above publication No. 2002-299761. This semiconductor separation layer may be used to separate the semiconductor wafer into individual semiconductor chips.

Further, a structure in which grooves are provided in the surface of a semiconductor substrate is known and used to accurately split the wafer, as described, e.g., in the above publication No. 2009-117494.

A semiconductor wafer is manufactured in the following manner: First, InP, InGaAsP, InGaAs, etc. are epitaxially grown on the entire surface of an InP substrate to provide the desired electrical or optical characteristics. Patterns are then formed for each of the identical chips (i.e., minimum product units) to be formed on the substrate. This is accomplished by repeating etching, transferring, and deposition (forming electrically insulating films, electrode films, etc.).

The semiconductor wafer is eventually separated into individual chips each constituting a minimum product unit. On the other hand, there are transactions in which semiconductor wafers with a number of semiconductor devices formed thereon are bought and sold without cutting them into individual chips. Further, some semiconductor wafers are cut into semiconductor bars with a plurality of semiconductor devices thereon, and these bars are traded without cutting them into individual chips. There is a known technique for separating these semiconductor wafers and bars into individual chips. This technique first scribes, e.g., a semiconductor wafer to form a crack therein and then applies external force to the semiconductor wafer so that the crack propagates, resulting in cleavage of the wafer.

If such scribing does not form a suitable crack, that is, if the formed crack does not extend straight perpendicular to the surface of the substrate, then it is not possible to produce suitable cleaved faces (i.e., straight perpendicular cleaved faces at the desired location) in the subsequent chip separation process, which uses the crack as a starting point for cleavage. Failure to form a suitable cleaved face results in production of a chip having an irregular configuration, which chip may be regarded as a defective product or may be difficult to handle in subsequent processes. If the cleaved face is used as a resonator end face of an optical semiconductor device, the quality of the cleaved face is the prime determining factor for the quality of the optical semiconductor device. In view of this, the present inventors have intensively studied cracks formed by scribing, and found the dominant factor in determining their configuration, which factor was not heretofore known.

The object of present invention is to provide a semiconductor wafer and semiconductor bar in which a suitable crack can be formed by scribing, and also to provide a method of manufacturing such a semiconductor wafer, a method of manufacturing such a semiconductor bar, and a method of manufacturing a semiconductor device.

It should be noted that the above dominant factor found by the present inventors is not mentioned in any of the above patent publications Nos. H03-16119, 2002-299761, and 2009-117494, and is a technical fact which was not heretofore known in the art. More specifically, the above three publications do not mention a suitable film structure in which a crack of the desired shape (i.e., a crack extending straight perpendicular to the surface of the substrate) can be formed by scribing its surface.

SUMMARY OF THE INVENTION

According to a first aspect of the present invention, a semiconductor wafer includes a substrate layer of semiconductor wafer substrate material, a semiconductor layer, a plurality of semiconductor devices. The semiconductor layer is provided on the substrate layer and includes one or more layers epitaxially grown on the substrate layer. The plurality of semiconductor devices are formed from the semiconductor layer and arranged across the surface of the semiconductor wafer.

The semiconductor layer includes an epitaxially grown InGaAs layer, and the InGaAs epitaxial layer has an opening which exposes the layer underlying the InGaAs epitaxial layer to at least the layer overlying the InGaAs epitaxial layer, the opening extending along lines along which the plurality of semiconductor devices are to be separated.

According to a second aspect of the present invention, a semiconductor wafer includes a substrate layer of semiconductor wafer substrate material and a semiconductor layer. The semiconductor wafer also includes an $SiO_2$ insulating film, an SiN insulating film, or a specific insulating film, which are provided on the substrate layer.

The semiconductor layer is provided on the substrate layer and includes one or more layers epitaxially grown on the substrate layer; The specific insulating film has properties equivalent to those of said SiO2 or SiN insulating film so that a vertical crack is not formed in said substrate layer when the surface of said specific insulating film is scribed.

The semiconductor wafer further includes a plurality of semiconductor devices formed from the semiconductor layer and arranged across the surface of the semiconductor wafer. The $SiO_2$ insulating film, the SiN insulating film, or the specific insulating film has an opening which exposes the layer underlying the film to at least the layer overlying the film. The opening either continuously extends along and between the plurality of semiconductor devices or is divided into separate openings which are spaced apart predetermined distances and arranged along and between the plurality of semiconductor devices.

According to a third aspect of the present invention, a semiconductor bar includes a substrate layer of semiconductor bar substrate material, a semiconductor layer, and a plurality of semiconductor devices. The semiconductor layer is provided on the substrate layer and includes one or more layers epitaxially grown on the substrate layer. The semiconductor bar also includes a plurality of semiconductor devices formed from the semiconductor layer and arranged along the length of the semiconductor bar. The semiconductor layer includes an epitaxially grown InGaAs layer. The InGaAs epitaxial layer has an opening which exposes the layer underlying the InGaAs epitaxial layer to at least the layer overlying the InGaAs epitaxial layer, the opening extending along lines along which the plurality of the semiconductor devices are to be separated.

According to a fourth aspect of the present invention, a semiconductor bar includes a substrate layer of semiconductor bar substrate material and a semiconductor layer. The semiconductor layer is provided on the substrate layer and includes one or more layers epitaxially grown on the substrate layer. The semiconductor bar also includes an $SiO_2$ insulating film, an SiN insulating film, or a specific insulating film, which are provided on the substrate layer. The specific insulating film has properties equivalent to those of said SiO2 or SiN insulating film so that a vertical crack is not formed in said substrate layer when the surface of said specific insulating film is scribed.

The semiconductor bar includes a plurality of semiconductor devices formed from the semiconductor layer and arranged along the length of the semiconductor bar. The $SiO_2$ insulating film, the SiN insulating film, or the specific insulating film has an opening which exposes the layer underlying the film to at least the layer overlying the film, the opening either continuously extending along and between the plurality of semiconductor devices or being divided into separate openings which are spaced apart predetermined distances and arranged along and between the plurality of semiconductor devices.

According to a fifth aspect of the present invention, a method of manufacturing a semiconductor wafer has one or more epitaxial layers formed thereon and having a plurality of semiconductor devices formed from the one or more epitaxial layers. The one or more epitaxial layers include an InGaAs epitaxial layer.

The method includes the step of forming an opening in the InGaAs epitaxial layer in such a manner that the opening exposes the layer underlying the InGaAs epitaxial layer to at least the layer overlying the InGaAs epitaxial layer. The opening either continuously extends along and between the plurality of semiconductor devices or is divided into separate openings which are spaced apart predetermined distances and arranged along and between the plurality of semiconductor devices.

According to a sixth aspect of the present invention, a method of manufacturing a semiconductor wafer has a plurality of semiconductor devices formed thereon and including an $SiO_2$ insulating film, an SiN insulating film, or a specific insulating film. The specific insulating film has properties equivalent to those of said SiO2 or SiN insulating film so that a vertical crack is not formed in said substrate layer when the surface of said specific insulating film is scribed.

The method includes the step of forming an opening in the $SiO_2$ insulating film, the SiN insulating film, or the specific insulating film in such a manner that the opening exposes the layer underlying the film to at least the layer overlying the film. The opening either continuously extends along and between the plurality of semiconductor devices or is divided into separate openings which are spaced apart predetermined distances and arranged along and between the plurality of semiconductor devices.

According to a seventh aspect of the present invention, a method of manufacturing a semiconductor bar has one or more epitaxial layers formed thereon and having a plurality of semiconductor devices formed from the one or more epitaxial layers. The one or more epitaxial layers include an InGaAs epitaxial layer.

The method includes the step of forming an opening in the InGaAs epitaxial layer in such a manner that the opening exposes the layer underlying the InGaAs epitaxial layer to at least the layer overlying the InGaAs epitaxial layer. The opening either continuously extends along and between the plurality of semiconductor devices or is divided into separate openings which are spaced apart predetermined distances and arranged along and between the plurality of semiconductor devices.

According to a eighth aspect of the present invention, a method of manufacturing a semiconductor bar has a plurality of semiconductor devices formed thereon and including an $SiO_2$ insulating film, an SiN insulating film, or a specific insulating film. The specific insulating film has properties equivalent to those of said SiO2 or SiN insulating film so that a vertical crack is not formed in said substrate layer when the surface of said specific insulating film is scribed.

The method includes the step of forming an opening in the $SiO_2$ insulating film, the SiN insulating film, or the specific insulating film in such a manner that the opening exposes the layer underlying the film to at least the layer overlying the film. The opening either continuously extends along and between the plurality of semiconductor devices or is divided into separate openings which are spaced apart predetermined distances and arranged along and between the plurality of semiconductor devices.

According to a ninth aspect of the present invention, a method of manufacturing a semiconductor device includes the step of providing a semiconductor wafer or a semiconductor bar.

The semiconductor bar is manufactured in accordance with the method of the fifth aspect or the sixth aspect. The semiconductor bar is manufactured in accordance with the method of the seventh aspect or the eighth aspect.

The method of manufacturing a semiconductor device includes the step of scribing the layer on the opening in the semiconductor bar so as to form cracks in the semiconductor bar; and after the scribing, separating the semiconductor bar along the cracks into individual chips each having a semiconductor device formed therein.

In accordance with the first to fourth aspects of the invention there are provided semiconductor wafers and semiconductor bars in which a suitable crack can be formed by scribing.

In accordance with the fifth to eighth aspects of the invention there are provided methods of manufacturing a semiconductor wafer or a semiconductor bar in which a suitable crack can be formed by scribing.

In accordance with the ninth aspect of the invention there is provided a method of manufacturing a semiconductor device, which produces chips having an accurate configuration.

BRIEF DESCRIPTION OF THE DRAWINGS

FIG. 1 is a schematic enlarged cross-sectional view of a portion of a semiconductor wafer or semiconductor bar which is to be scribed.

FIG. 4 is a diagram showing detailed illustrations based on photographs of crack configurations formed experimentally by the present inventors.

FIG. 5 shows a table listing the results of experiments conducted by the present inventors.

FIG. 15 is a diagram to describe a comparative structure, which has an InGaAs epitaxial layer on a scribed portion.

FIG. 16 is a diagram to describe a comparative structure, which has an InGaAs epitaxial layer on a scribed portion.

FIG. 17 is a diagram to describe a comparative structure, which has an InGaAs epitaxial layer on a scribed portion.

DETAILED DESCRIPTION OF THE PREFERRED EMBODIMENTS

First Embodiment

Description of Basic Technique of First Embodiment

The basic technique of a first embodiment of the present invention will be described before specifically describing a semiconductor wafer of the embodiment and a method of manufacture thereof. As a result of intensive study, the present inventors have found that the shape of a crack formed in a semiconductor wafer of InP substrate material when the surface of the semiconductor wafer is scribed is significantly different depending on whether or not the wafer has an InGaAs epitaxial layer, as described below.

With reference to FIGS. 1 to 6, the following description is first directed to typical cracks formed in a semiconductor substrate structure not having an InGaAs epitaxial layer when the surface of the structure is scribed. These cracks have favorable or acceptable shapes. Then with reference to FIGS. 12 to 15, the description is directed to typical cracks formed in a semiconductor substrate structure having an InGaAs epitaxial layer when the surface of the structure is scribed. These cracks have unfavorable shapes, meaning that the InGaAs epitaxial layer in the structure prevents the formation of a suitable crack.

Figure 1:
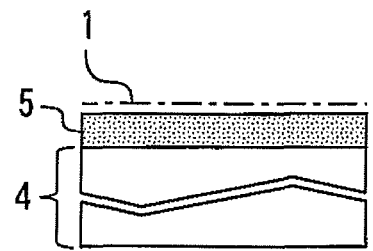
FIG. 1 is a diagram used to describe the basic technique of the first embodiment, specifically.
Figure 2:
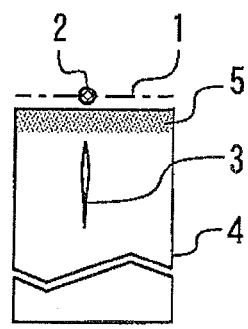
FIG. 2 is a schematic enlarged cross-sectional view of the portion shown in FIG. 1 after its surface has been scribed.

FIG. 1 is a diagram used to describe the basic technique of the first embodiment, specifically, FIG. 1 is a schematic enlarged cross-sectional view of a portion of a semiconductor wafer or semiconductor bar which is to be scribed, which portion does not have an InGaAs epitaxial layer. The reference numerals in FIG. 1 indicate the following components. Reference numeral 1 denotes a surface to be scribed, 4 denotes an InP substrate, and 5 denotes an epitaxial layer. In accordance with the first embodiment, the epitaxial layer 5 is an InGaAsP epitaxial layer. FIG. 2 is a schematic enlarged cross-sectional view of the portion shown in FIG. 1 after its surface has been scribed. In FIG. 2, reference numeral 2 denotes a scribing position (or point) and 3 denotes a crack. The scribing position is where the scribing tool is in contact with the surface of the semiconductor wafer.

Figure 3:
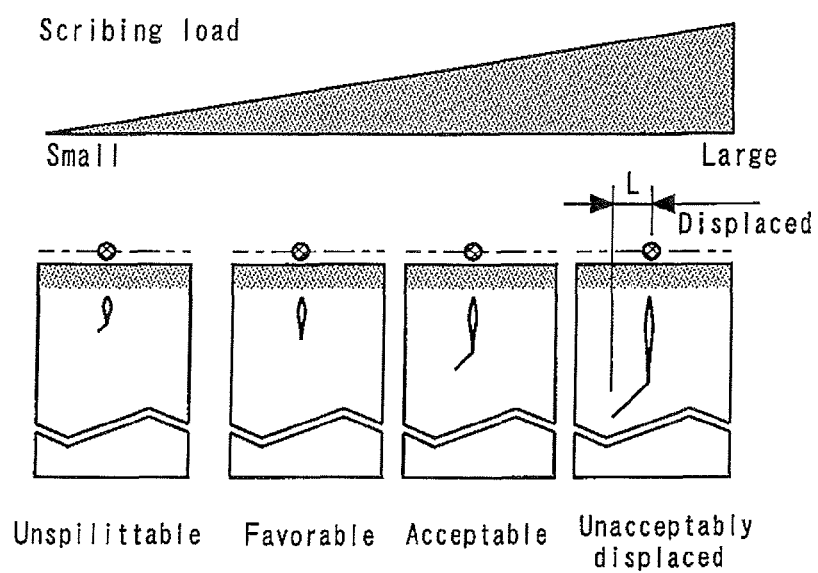
FIG. 3 is a diagram illustrating typical shapes of cracks formed in this portion under different scribing loads.

FIG. 3 is a diagram illustrating typical shapes of cracks formed in this portion under different scribing loads. FIG. 4 is a diagram showing detailed illustrations based on photographs of crack configurations formed experimentally by the present inventors. Specifically, FIG. 4A, which shows a crack 10, corresponds to the two illustrations at the left side of FIG. 3, which show cracks in a unsplittable state and in a favorable state, respectively. FIG. 4B, which shows a crack 12, corresponds to the two illustrations at the right side of FIG. 3, which show cracks in an acceptable state and in an unacceptably displaced state, respectively.

FIG. 5 shows a table listing the results of experiments conducted by the present inventors. In FIG. 5, the term "scribing load" means the force with which the scriber is pressed against the wafer, and the term "scribing speed" means the speed at which the scriber is run across the wafer while the scribing load is being applied. It should be noted, however, that when the scriber is run across the wafer, the scriber may not necessarily move in a straight line, that is, the scriber may bounce from the surface if the load is light and the speed is high. Further, in accordance with the first embodiment, scribing is done by the application of mechanical force to a portion of a semiconductor wafer or bar which is to be scribed. In FIG. 5, the phrase "vertically then obliquely extending" indicates irregular crack states such as those two shown at the right side of FIG. 3.

Figure 12:
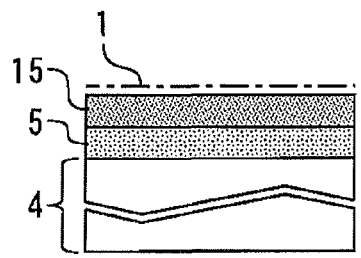
FIG. 12 is a diagram to describe a comparative structure, which has an InGaAs epitaxial layer on a scribed portion.
Figure 13:
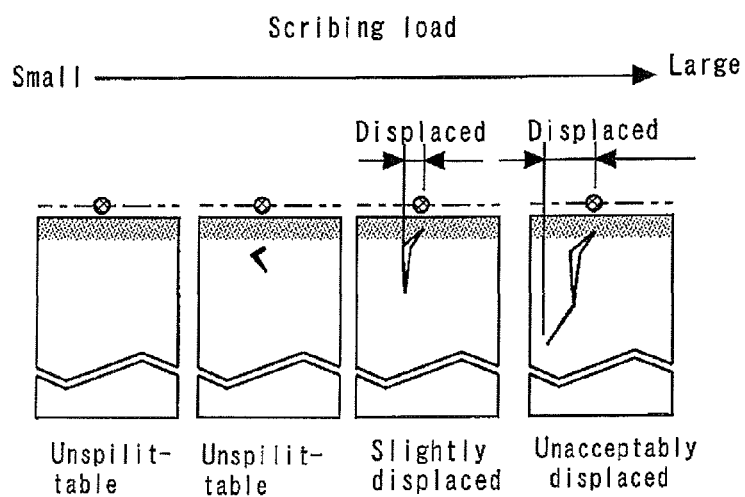
FIG. 13 is a diagram to describe a comparative structure, which has an InGaAs epitaxial layer on a scribed portion.
Figure 14A:
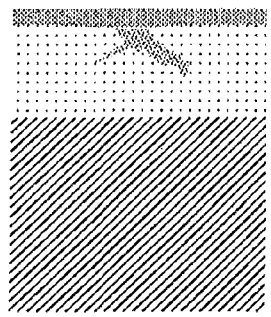
FIG. 14 is a diagram to describe a comparative structure, which has an InGaAs epitaxial layer on a scribed portion.
Figure 14B:
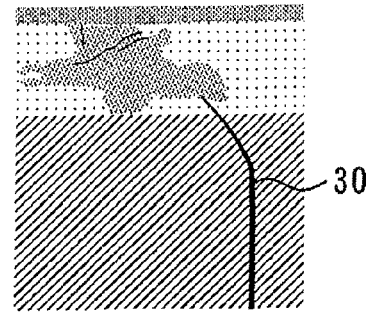

FIGS. 12 to 15 are diagrams used to describe a portion of a semiconductor wafer or semiconductor bar which is to be scribed, which portion has an InGaAs epitaxial layer. This comparative structure is compared with that of the first embodiment. The layer structure shown in FIG. 12 includes an InGaAs epitaxial layer 15. Except for this feature, the structure of FIG. 12 is similar to that described above with reference to FIG. 1. FIG. 13 is a diagram illustrating typical shapes of cracks formed in this portion under different scribing loads. FIG. 14 is a diagram showing detailed illustrations based on photographs of the configurations of cracks experimentally formed in the comparative structure of FIG. 12 by the present inventors. Specifically, FIG. 14A shows a crack state corresponding to the unsplittable states shown at the left side of FIG. 13. (In FIG. 14A, no crack is observed.) FIG. 14B shows a crack 30 in a state corresponding to the slightly displaced state and the unacceptably displaced state shown at the right side of FIG. 13.

FIG. 15 shows a table listing the results of experiments conducted by the present inventors. These experiments used the same scribing loads and the same scribing speeds as those used by the experiments shown in FIG. 5. In some of these experiments, no crack was formed. The formed cracks were classified into three types: vertically extending cracks; obliquely then vertically extending cracks, and obliquely extending cracks. The table of FIG. 15 lists the number of occurrences for each type of crack and the number of occurrences where no crack was formed.

Referring back to FIG. 5, when the scribing load was 6 gf and the scribing speed was 50 um/s, the number of occurrences (N number) of vertically extending cracks was 4; when the scribing load was 8 gf and the scribing speed was 50 um/s, the number of occurrences of vertically then obliquely extending cracks was 4; and when the scribing load was 10 gf and the scribing speed was 50 um/s, the number of occurrences of vertically then obliquely extending cracks was 5. In the experiments shown in FIG. 15, on the other hand, when the scribing load was 6 gf, 8 gf, and 10 gf, the number of occurrences of vertically extending cracks was zero. Further, in the experiments shown in FIG. 15, a vertically then obliquely extending crack did not appear. Comparison of FIG. 5 with FIG. 15 reveals that in the experiments shown in FIG. 5, the frequency of occurrences of vertically extending cracks is higher than that in the experiments shown in FIG. 15.

Further, in the case of both vertically extending cracks and vertically then obliquely extending cracks (which appeared in the experiments shown in FIG. 5), they extend vertically from their point of origin. In the case of obliquely then vertically extending cracks (which appeared in the experiments shown in FIG. 15), on the other hand, they extend obliquely from their point of origin. This means that vertical cracks are more likely to occur in the semiconductor substrate structure of FIG. 1 (which was used in the experiments shown in FIG. 5) than in the semiconductor substrate structure of FIG. 12 (which was used in the experiments shown in FIG. 15).

It should be noted that in the table of FIG. 5, when the scribing load is 6 gf and the scribing speed is 50 um/s, the number of occurrences of vertically extending cracks is 4, that is, this scribing condition is most suitable for forming vertical cracks. When the scribing load is 8 gf and 10 gf, on the other hand, the number of occurrences of vertically extending cracks is small (1 and 0, respectively). This means that the number of occurrences of vertically extending cracks decreases rapidly when the scribing load exceeds some threshold value between 6 gf and 8 gf. That is, cracks may tend to extend vertically when the scribing load is smaller than this threshold value.

The present inventors consider that the difference between the experiment results shown in FIGS. 5 and 15 results from the fact that the crystal structure of InGaAs (which is used in the comparative semiconductor substrate structure shown in FIG. 12) causes cracks to extend obliquely, not vertically. This means that a portion of, e.g., a semiconductor wafer in which a crack is to be formed by scribing its surface with a scribing tool may not be provided with an InGaAs layer, that is, may have a structure similar to that shown in FIG. 1. (FIG. 5 shows the results of scribing experiments on the structure shown in FIG. 1.) This increases the frequency of occurrences of vertically extending cracks and vertically then obliquely extending cracks (i.e., cracks extending vertically from their point of origin).

This technique has the following various advantages.

A first advantage is that scribing a semiconductor substrate portion not having an InGaAs layer results in the formation of a crack therein which extends vertically straight and whose length increases with increasing scribing load. (It should be noted that when the scribing load is relatively light, the resulting crack is not long enough that the substrate can be split apart.) As a result, it is possible to make sure that the crack extends vertically downward from a point below the scribing position, thereby increasing the accuracy of the position and orientation of the plane along which the substrate is split.

A second advantage is attained when the technique is applied to the manufacture of laser diodes (or semiconductor lasers), which have two opposing cleaved faces, wherein the distance between these faces serves as the resonator length. Each cleaved face can be formed at the desired position and orientation by use of the above technique, since the crack can be formed to extend vertically straight from a point below the scribing position. Therefore, the desired distance can be obtained between the cleaved faces, resulting in the desired optical characteristics of the laser diode. The following describes in more detail how the cleavage method used affects the position and orientation of the cleaved faces. In the case of laser diodes, or semiconductor lasers, which have two opposing cleaved faces (where the distance between these faces corresponds to the resonator length), if the cleaved faces are not formed at the desired position and orientation (just below scribing position), the distance between these faces is not equal to the desired distance, making it impossible to achieve the desired optical characteristics. The positions and orientations of the cleaved faces, which are formed by scribing, etc., govern the accuracy of the resonator length of the optical semiconductor device. The accuracy of the resonator length is important to ensure the desired characteristics of the optical semiconductor device. Devices which do not satisfy the required resonator length accuracy are regarded as defective products for that reason alone. Further, for example, the laser light emitting portion of optical semiconductor devices is important, since a window structure is formed therein to adjust the characteristics of the device. Therefore, an accurate cleaving technique is required to cleave the wafer (or substrate) in the desired plane. As described above, the basic technique of the first embodiment can be used to cleave the wafer in the desired planes with precision.

A third advantage is that since the wafer can be accurately split in the desired planes, there is no need for the wafer to have regions for accommodating variations in the positions and orientations of the split planes, thus eliminating the need to reduce the number of chips formed in the wafer in order to provide such regions. It is often necessary that the number of chips formed in a wafer be reduced in order to provide regions for accommodating variations in the positions and orientations of the split planes. One effective way to increase the manufacturing productivity of chips is to increase the number of chips per wafer. Doubling the number of chips per wafer (also referred to as "yield"), e.g., by eliminating redundant areas on the wafer, means roughly a 50% decrease in the chip cost. There has also been a continuing demand to reduce the size and the component density of products using chips. This demand can also be met by reducing the size of the wafer regions for accommodating variations in the positions and orientations of the split planes and thereby reducing the size of each chip. As described above, the basic technique of the first embodiment can be used to form suitable cracks (i.e., vertically extending cracks) in a semiconductor wafer, making it possible to increase the accuracy of the positions and orientations of the planes along which the wafer is split into chips. In this way the wafer regions for accommodating variations in the positions and orientations of the split planes can be reduced.

A fourth advantage is an improvement in the accuracy of the configuration of chips and in the yield of chips, as described below. As described above, the basic technique of the first embodiment can be used to form vertical cracks in a semiconductor wafer at the desired positions, so that the wafer can be split into chips having an accurate configuration (or dimensions). This means that the configuration of each chip is accurate with respect to the position of the light emitting portion (or light receiving portion), if any, of the chip. Therefore, for example, when a chip having a light emitting portion (or a light receiving portion) is mounted by an automatic chip mounting apparatus, it is only necessary to recognize the configuration of the chip. There is no need to recognize the position of the light emitting portion (or light receiving portion) of the chip. This results in reduced cost of the chip mounting apparatus, as compared to when both the configuration of the chip and the position of the light emitting portion (or light receiving portion) of the chip are recognized.

If the positions and orientations of the cleaved planes of a wafer are not accurate, the configuration of the chips is not accurate with respect to the position of the light emitting portion (or light receiving portion), if any, of the chips. As a result, when a chip is mounted by use of an automatic chip mounting apparatus, the apparatus must recognize both the configuration of the chip and the position of the light emitting portion (or light receiving portion) of the chip. An expensive mounting apparatus is required to mount a chip if it is necessary to recognize both the configuration of the chip and the position of the light emitting portion (or light receiving portion) of the chip.

More specifically, in order to hold a chip having an irregular configuration by use of a pick-up (tweezers or the collet chuck of the mounting apparatus) for mounting, the holding device must have a sophisticated control function and adjustment function to prevent the formation of fine cracks and chipping due to the holding force. The formation of such fine cracks may affect the reliability of the chip. Further, chippings may cause problems with the die bonding and wire bonding when they are caught in the tool. In the case of an optical semiconductor device, if chippings are attached to the optical path, they may block light.

In order to prevent this from happening, the basic technique of the first embodiment can be used to form vertical cracks in the semiconductor wafer at the desired positions so that the wafer can be split into chips having an accurate configuration, with the result that various problems which may occur during the postprocess following the chip separation process can be prevented.

A fifth advantage is that it is possible to minimize the scribing load, thereby reducing the cost of the scribing tool and the cost of replacing the scribing tool. That is, the technique of the first embodiment facilitates formation of cracks in a semiconductor wafer when the wafer is scribed. When a scribing tool such as a diamond tool, which applies mechanical force, is used to scribe a wafer, a load must be applied to the tool in order to form a crack in the wafer. The greater the load which must be applied to the tool (hereinafter referred to as the "scribing load") to form a crack in the wafer, the greater the wear of the tool, resulting in increased tool cost and increased tool replacement cost. In order to prevent this, the basic technique of the first embodiment may be used to reduce the required scribing load (as compared to the case where the structure to be scribed is provided with an InGaAs layer), resulting in reduced wear of the tool.

Structure of First Embodiment

The basic technique of the first embodiment described above (that is, the idea that a semiconductor substrate portion in which a crack is to be formed by scribing its surface should be constructed without an InGaAs layer) may be applied to the following various specific substrates, etc.

(i) The technique, or idea, of the first embodiment may be applied to various semiconductor substrates, such as semiconductor wafers and semiconductor bars, which are scribed so that they can be split into individual semiconductor chips.

(ii) In such cases, the portions of the substrate directly below the scribe lines, directly below the initial cleavage sites, or directly below the chip separation lines may be constructed without an InGaAs layer.

(iii) Specifically, only a part of the portions of the substrate directly below the scribe lines, directly below the initial cleavage sites, or directly below the chip separation lines may be constructed without an InGaAs layer, or alternatively the entire part of these portions may be constructed without an InGaAs layer. That is, in a semiconductor wafer or semiconductor bar having a plurality of semiconductor devices arranged therein, these portions may be entirely constructed without an InGaAs layer, or alternatively only portions of the wafer (or bar) in which vertical cracks need be formed or to which a relatively light scribing load need be applied may be constructed without an InGaAs layer. For example, in the case of a substrate with a layer structure including an InGaAs layer sandwiched between upper and lower layers, the above portions constructed without an InGaAs layer may be openings (including trenches, etc.) in the InGaAs layer which expose the lower layer to the upper layer. (These openings of the InGaAs layer can be referred to as "underlayer-exposing portions.") (iv) The openings of the InGaAs layer (i.e., the portions constructed without an InGaAs layer) may extend entirely along the lines along which the plurality of semiconductor devices are separated, or alternatively these openings may be each divided into separate portions which are arranged along these lines. Further, the openings may extend partially along the lines along which the plurality of semiconductor devices are separated, that is, they may extend along only one or both ends of the lines. Alternatively, these openings may extend entirely along the lines.

In the following examples, the basic technique of the present invention is applied to a semiconductor wafer and a semiconductor bar.

Example 1

The following procedure is used to manufacture a semiconductor wafer from which semiconductor devices having the desired electrical and optical characteristics can be obtained: First, InP, InGaAsP, InGaAs, etc. are epitaxially grown on the entire surface of an InP substrate, and then patterns are formed for each of the identical chips (i.e., minimum product units) to be formed on the substrate. This is accomplished by repeating etching, transferring, and deposition (forming electrically insulating films, electrode films, etc.). The semiconductor wafer thus manufactured is eventually separated into individual chips each constituting a minimum product unit.

In recent years, some semiconductor wafers with a number of semiconductor devices formed thereon are bought and sold without cutting them into individual chips (this practice being also referred to as "wafer trading"). The basic technique of the first embodiment may be applied to such semiconductor wafers having a number of semiconductor devices formed thereon.

The semiconductor wafer of Example 1 includes an InP layer of substrate material on which are epitaxially grown an InP layer, an InGaAsP layer, and an InGaAs layer. The semiconductor wafer has a plurality of optical semiconductor devices (namely, semiconductor lasers) formed from the epitaxially grown layers and arranged across the surface of the semiconductor wafer. The InGaAs epitaxial layer has openings (or underlayer-exposing portions) such as those described above. The semiconductor wafer may be scribed along these openings (that is, the layer on the openings is scribed), thereby forming vertically extending cracks.

Example 2

Some semiconductor wafers are not cut into individual chips (i.e., minimum product units) before being shipped, as described above. These semiconductor wafers may be cut into semiconductor bars with a plurality of semiconductor device thereon, and these bars may be bought and sold. That is, not only semiconductor wafers but also semiconductor bars themselves may be traded as commercial products, and they may be scribed and cleaved or separated into individual chips by the purchaser. The term "semiconductor bar" as used herein refers to a rod-like (rectangular) semiconductor structure on which are formed one or a plurality of rows of semiconductor devices (e.g., optical semiconductor devices, especially those having resonator end faces, such as semiconductor lasers). It should be noted that when a semiconductor wafer is separated into individual semiconductor devices (or chips), the wafer is first cut into semiconductor bars which are then cut into the semiconductor devices. That is, the semiconductor bars are so-called intermediate products. The basic technique of the first embodiment may also be applied to semiconductor bars.

Like the semiconductor wafer of Example 1, the semiconductor bar of Example 2 has an InGaAs epitaxial layer having openings (or underlayer-exposing portions) which continuously extend along and between the plurality of optical semiconductor devices and which expose the layer underlying the InGaAs epitaxial layer to at least the layer overlying the InGaAs epitaxial layer. The semiconductor bar may be scribed along these openings (that is, the layer on the openings is scribed), thereby forming vertically extending cracks.

It should be noted that the purchaser's specifications may require that so-called semiconductor wafer pieces (i.e., rectangular wafer pieces which can be cut into bars and chips) be supplied instead of semiconductor wafers or bars. (Semiconductor wafer pieces are formed by cutting a wafer into segments.) That is, semiconductor wafer pieces may also be traded as commercial products. In one form of transaction, a wafer with different types of devices formed thereon may be manufactured and this wafer may be cut into semiconductor wafer pieces in accordance with the specifications of each purchaser and sold. These semiconductor wafer pieces are similar to semiconductor wafers (such as those described in Example 1) in that they have a plurality of semiconductor devices formed thereon and can be traded without cutting them into individual chips. Therefore, the term "semiconductor wafer" as used herein also refers to a semiconductor wafer piece.

Manufacturing Method of First Embodiment

A method of manufacturing a semiconductor device in accordance with the first embodiment will now be described. FIGS. 6 to 11 are diagrams illustrating a method of manufacturing a semiconductor wafer, a semiconductor bar, and a semiconductor device in accordance with the first embodiment.

Figure 6:
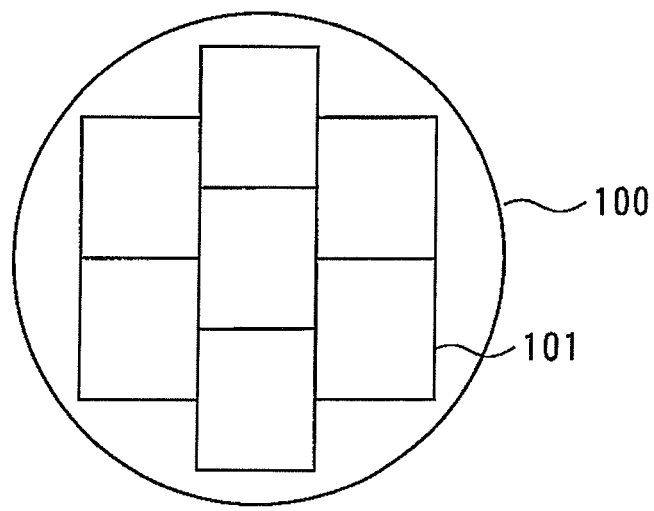
FIG. 6 is a diagram illustrating a method of manufacturing a semiconductor wafer, a semiconductor bar, and a semiconductor device in accordance with the first embodiment.

First, the semiconductor wafer 100 shown in FIG. 6 is manufactured using an InP substrate preparation process, an epitaxial growth process, and a wafer process. FIG. 6 is a plan view of the semiconductor wafer 100, which has a plurality of semiconductor laser devices formed thereon. Specifically, first, InP, InGaAsP, and InGaAs, etc. are epitaxially grown on the entire surface of a starting InP substrate (on which devices are to be formed). Patterns are then formed for each of the identical chips (i.e., minimum product units) to be formed on the substrate by repeating etching, transferring, and deposition (forming electrically insulating films, electrode films, etc.), thereby forming semiconductor laser device formation regions 101 and producing the semiconductor wafer 100.

When the semiconductor laser device formation regions 101 are formed, the basic technique of the first embodiment may be used to remove the InGaAs epitaxial layer (or all epitaxial layers) from the portions of the wafer in which cracks are to be formed by scribing their surface. It is preferable to remove only the InGaAs epitaxial layer in those portions, since removal of all epitaxial layers requires additional processes. Specifically, some particular portions of the InGaAs epitaxial layer need be removed to form the semiconductor devices and adjust their characteristics during the wafer process. Therefore, the InGaAs epitaxial layer in the portions of the wafer in which cracks are to be formed by scribing are preferably removed in this removal step, thereby eliminating the need for an additional removal step.

This completes the manufacture of the semiconductor wafer 100 of the first embodiment.

Figure 7:
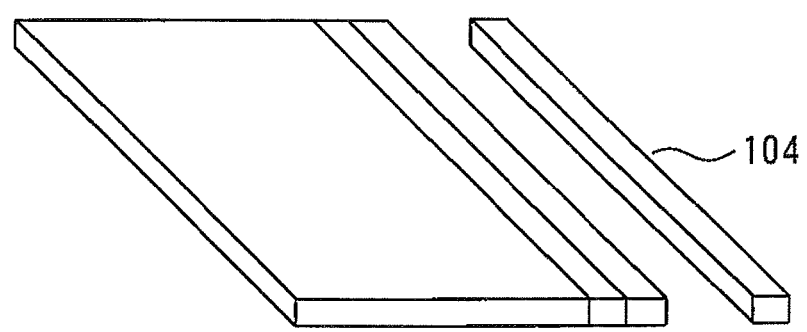
FIG. 7 is a diagram illustrating a method of manufacturing a semiconductor wafer, a semiconductor bar, and a semiconductor device in accordance with the first embodiment.
Figure 8:
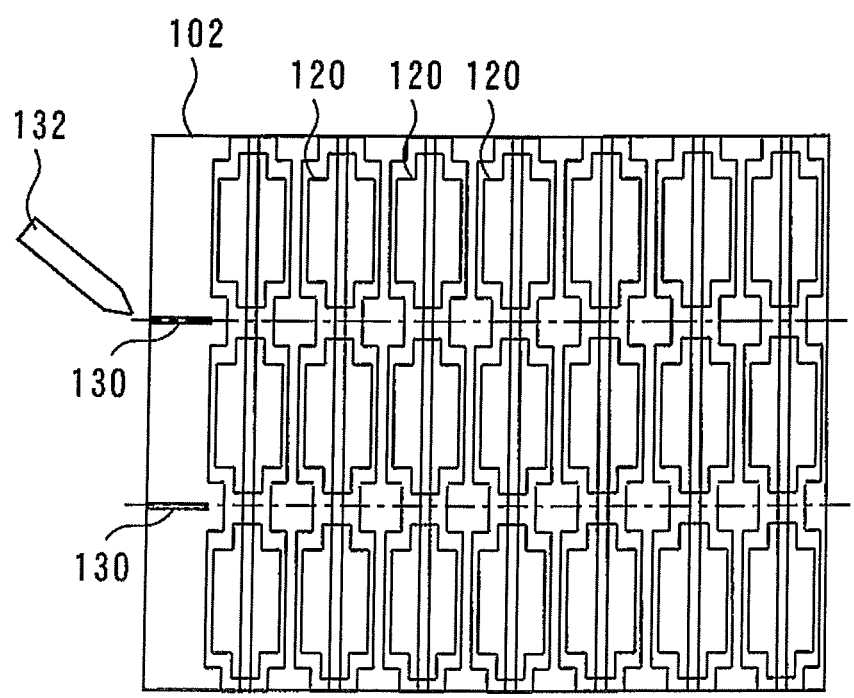
FIG. 8 is a diagram illustrating a method of manufacturing a semiconductor wafer, a semiconductor bar, and a semiconductor device in accordance with the first embodiment.

Next, the semiconductor wafer 100 is cut into semiconductor wafer pieces 102, and each semiconductor wafer piece 102 is then cleaved into a plurality of bars 104, as shown in FIG. 7. FIG. 8 is a schematic diagram illustrating the cleavage step in the manufacturing method of the first embodiment. In FIG. 8, the chain lines indicate lines along which the semiconductor wafer 102 is split (or cleaved). (These lines extend along the rows of semiconductor laser devices 120.) In accordance with the present embodiment, the portions of the semiconductor wafer piece 120 indicated by reference numeral 130 are scribed by a diamond tool 132, as shown in FIG. 8. (These portions extend along the rows of semiconductor laser devices 120.)

It should be noted that, in accordance with the present embodiment, the portions of the semiconductor wafer piece 102 indicated by reference numeral 130 need not be split by cleavage (i.e., they need not be exact cleavage sites), and therefore these portions are scribed to form cracks for initiating cleavage. Accordingly, the InGaAs epitaxial layer may be removed only from these portions indicated by reference numeral 130. The resulting openings (or the underlayer-exposing portions) of the InGaAs epitaxial layer extend only partially along lines along which the semiconductor wafer piece 102 is split into individual semiconductor bars, that is, extend only one end of these lines.

Figure 9:
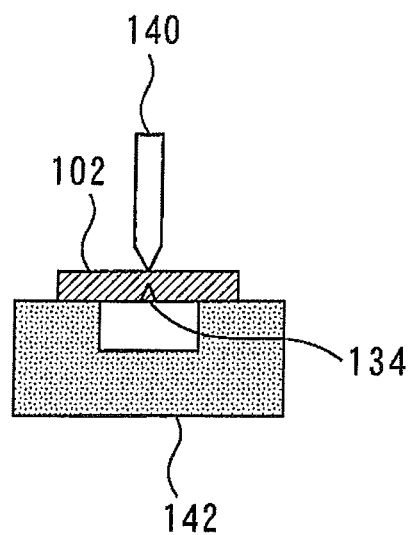
FIG. 9 is a diagram illustrating a method of manufacturing a semiconductor wafer, a semiconductor bar, and a semiconductor device in accordance with the first embodiment.

Then, by using a blade 140 and a slit (or bed knife) 142, force is applied to the surface of the semiconductor wafer piece 102 opposite that having a scribe cut 134 (i.e., a crack formed by scribing), as shown in FIG. 9. This causes the semiconductor wafer piece 102 to be cleaved along the desired line (indicated by the chain lines in FIG. 8), starting from the scribe cut 134. This process is referred to as the "break process." It should be noted that cleavage is the tendency of a crystal to split along crystalline planes of weak bonding when force is applied to the crystal. Cleavage is used to form the end faces of a lasing resonator, as well as to control the resonator length with precision.

Figure 10:
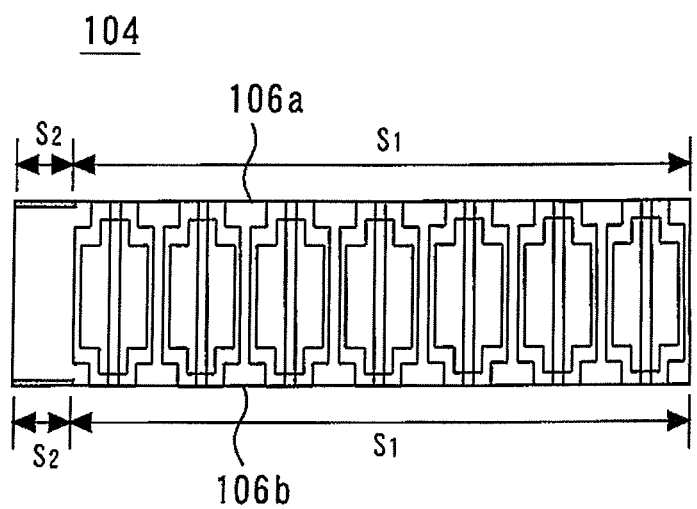
FIG. 10 is a diagram illustrating a method of manufacturing a semiconductor wafer, a semiconductor bar, and a semiconductor device in accordance with the first embodiment.

Then as shown in FIG. 10, the cleaved surfaces 106a and 106b of the semiconductor bar 104 are coated with a protective film. It should be noted that in FIG. 10, reference numeral $S_1$ indicates surfaces that need be formed by cleavage, i.e., need be cleaved surfaces (used as resonator end faces), and $S_2$ indicates surfaces that need not be formed by cleavage. In accordance with the present embodiment, only the portions indicated by $S_2$ are scribed. That is, the portions to be scribed extend only along one end of the lines along which the semiconductor wafer piece 102 is split into semiconductor bars having a plurality of semiconductor laser devices (these lines being indicated by the chain lines in FIG. 8).

This completes the manufacture of the semiconductor bar 104 of the first embodiment. (It should be noted that the application of the protective film may not be necessary.)

Figure 11:
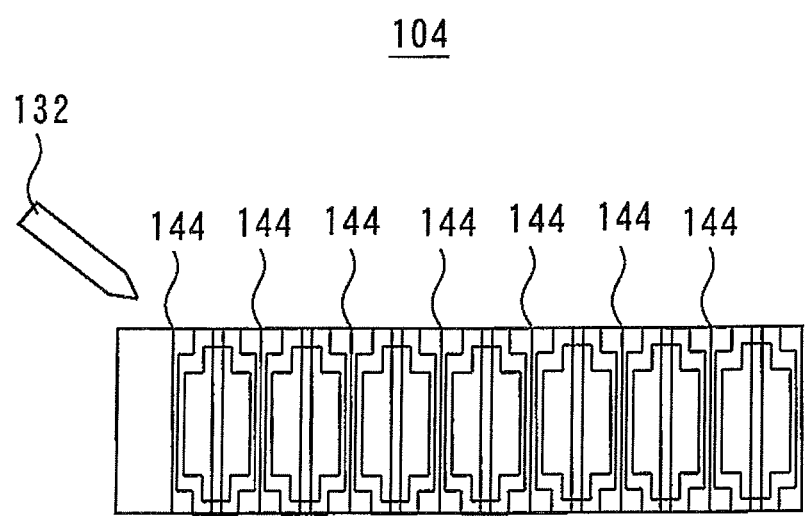
FIG. 11 is a diagram illustrating a method of manufacturing a semiconductor wafer, a semiconductor bar, and a semiconductor device in accordance with the first embodiment.

Next, the semiconductor bar 104 is separated into a plurality of individual semiconductor laser chips. FIG. 11 is a diagram illustrating the semiconductor laser chip separation process in accordance with the first embodiment. In accordance with the first embodiment, a diamond tool 132 is used to scribe the semiconductor bar 104 along the lines 144 shown in FIG. 11. Thus the bar is scribed along the entire lines 144 to form cracks therein, since the split faces to be formed by the subsequent beak process are not resonator end faces and hence need not be formed by cleavage. The break process is then performed using a blade and a slit in the same manner as described above with reference to FIG. 9.

Next, each semiconductor laser chip is mounted. This may be done by use of an automatic chip mounting apparatus. In that case, since the dimensions of the semiconductor laser chip are accurate, it is only necessary for the automatic chip mounting apparatus to recognize the configuration of the chip. There is no need to recognize the position of the light emitting portion of the chip. This results in reduced cost of the chip mounting apparatus, as compared to when both the configuration of the chip and the position of the light emitting portion of the chip are recognized.

This completes the manufacture of the semiconductor device in accordance with the first embodiment.

Variations of First Embodiment

In accordance with the first embodiment, after an InGaAs epitaxial layer is grown on a substrate (i.e., semiconductor wafer, bar, etc.), the InGaAs epitaxial layer is removed from the portions of the substrate in which cracks are to be formed by scribing their surface, thereby forming openings (or underlayer-exposing portions) in the layer. (This makes it possible to form vertically extending cracks in those portions by scribing their surface.) However, the present invention is not limited to this way of forming openings.

For example, an InGaAs epitaxial layer may be formed on the substrate using a mask so that the layer has such openings. (That is, the InGaAs epitaxial layer is not grown on the portions of the substrate in which cracks are to be formed by scribing their surface.) The resulting InGaAs epitaxial layer has the same configuration as the InGaAs epitaxial layer of the first embodiment.

This also makes it possible to form vertically extending cracks in the substrate at the desired locations. Thus, various methods may be used to form the openings (or underlayer-exposing portions) in the InGaAs epitaxial layer, depending on the device structure. However, the present invention only requires that the portions of the substrate (i.e., semiconductor wafer, bar, etc.) in which cracks are to be formed by scribing their surface be constructed without an InGaAs epitaxial layer.

As described above, the openings (or underlayer-exposing portions) of the InGaAs epitaxial layer are formed so as to expose the layer underlying the InGaAs epitaxial layer to at least the layer overlying the InGaAs epitaxial layer. That is, these openings may be covered with other layers.

Further, epitaxial layers (if any) under the InGaAs epitaxial layer may also be removed from the portions of the substrate in which cracks are to be formed by scribing, or alternatively they may be left below the openings of the InGaAs epitaxial layer, thus forming the bottom of the openings. Examples of such epitaxial layers include InP, InGaAsP, and FeInP epitaxial layers. It should be noted that insulating films are not epitaxial layers.

Further, the InGaAs epitaxial layer and all underlying layers (except for the substrate layer) may be removed from the portions of the substrate in which cracks are to be formed by scribing, thereby exposing the substrate layer (in the first embodiment, an InP layer) of the semiconductor wafer.

It should be noted that the first embodiment has been described in connection with semiconductor wafers having optical semiconductor devices (namely, semiconductor laser devices 120) formed thereon. It is to be understood, however, that the present invention is not limited to this particular type of semiconductor device. In addition to semiconductor lasers, the present invention may be applied to various types of semiconductor light emitting devices, semiconductor light receiving devices (or photodetectors), optical modulators, and other optical devices. Further, the present invention may be applied to semiconductor wafers or bars having formed thereon a number of, e.g., transistors (e.g., FETs, bipolar transistors, or any other type of transistors) or diodes, instead of optical semiconductor devices of the first embodiment. Also in such cases, the present invention provides the advantages described above in connection with the semiconductor wafers or bars of the first embodiment which have optical semiconductor devices formed thereon. For example, the semiconductor wafers or bars can be accurately split into individual semiconductor chips or devices with split surfaces of high quality, and the scribing load applied by the scribing tool can be reduced.

Although in the first embodiment the substrate 4 of the semiconductor wafer is made of InP, it is to be understood that the present invention is not limited to this particular substrate material. In other embodiments the substrate material may be GaAs instead of InP.

When semiconductor wafers or bars with semiconductor devices formed thereon are traded and hence delivered from one place to another, they are inevitably subjected to a load or force. Therefore, it is preferable to avoid forming many grooves or recesses in such semiconductor wafers and bars, since that would reduce their strength. Especially, it is not desirable that a semiconductor wafer has a groove or recess reaching its semiconductor substrate layer (or bottom layer), since that would significantly reduce the strength of the semiconductor wafer, preventing the wafer from being readily and easily handled (e.g., when it is traded). The same goes for a semiconductor bar with a groove or recess reaching its substrate layer.

The first embodiment solves this problem. In accordance with the first embodiment, the portions of a semiconductor substrate (e.g., a semiconductor wafer or bar) in which cracks are to be formed by scribing their surface are constructed without an InGaAs epitaxial layer. Specifically, after growing an InGaAs epitaxial layer on the substrate, the InGaAs epitaxial layer may be removed from those portions of the substrate in which cracks are to be formed by scribing, thereby forming openings in the layer. Alternatively, when an InGaAs epitaxial layer is grown on the substrate, a mask is used to form such openings in the layer. This makes it possible to form the desired vertical cracks in the substrate without forming grooves or recesses in the epitaxial layers and substrate layer underlying the InGaAs epitaxial layer. That is, there is no need for additional processes to remove portions of the underlying epitaxial layers (and substrate layer), as described in connection with the manufacturing method of the first embodiment.

The structures and manufacturing methods of the first embodiment described above are based on the finding that the quality, or shape, of a crack formed in a semiconductor substrate structure when the surface of the structure is scribed depends primarily on the presence or absence of an InGaAs epitaxial layer in the structure, which finding was made by the present inventors after intensive study.

It should be noted that it is not easy for even those skilled in the art to conceive the above idea that the portions of a semiconductor substrate (e.g., a semiconductor wafer or bar) in which cracks are to be formed by scribing their surface should be constructed without an InGaAs epitaxial layer, that is, the idea of removing the InGaAs epitaxial layer from those portions of the substrate (without removing the underlying epitaxial layers).

Specifically, for example, the InGaAs epitaxial layer grown on a semiconductor wafer is very thin (e.g., approximately 1 μm) whereas the wafer thickness is typically approximately 100 μm and is governed by the thickness of the InP substrate of the wafer. It should be noted that a separate InP substrate can be accurately cleaved by the application of a force of only 6 gf, producing cleaved faces of good quality. In view of this, it is not easy to find that the presence or absence of an InGaAs epitaxial layer on an InP substrate significantly affects the quality of a crack formed in the substrate when the surface of the substrate is scribed. Further, it is difficult for those skilled in the art to come up with the idea of removing a portion of such a thin epitaxial layer (having a thickness of approximately 1 μm) on a substrate in order to allow the formation of a suitable crack in the substrate, since there is increasing demand to reduce man-hour requirements (for designing) in order to increase productivity. That is, since the implementation of the idea may require an increase in the number of processes required, those skilled in the art are not motivated to consider it. Under these circumstances, however, the present inventors have found the basic technique of the first embodiment after further intensive study.

Second Embodiment

There has been described, in connection with the first embodiment, how the presence or absence of an InGaAs epitaxial layer in a semiconductor substrate structure affects the quality, or shape, of a crack formed in the structure when the surface of the structure is scribed (as found by the present inventors). The present inventors have also found that the presence or absence of an electrically insulating film such as $SiO_2$ or SiN in a semiconductor substrate structure also significantly affects the quality, or shape, of a crack formed in the structure when the surface of the structure is scribed, as in the first embodiment.

FIGS. 16 and 17 are diagrams used to describe a semiconductor substrate structure in which a crack is to be formed by scribing its surface, which structure has an electrically insulating film. This comparative structure is compared with that of the first embodiment. The layer structure shown in FIG. 16 includes an electrically insulating film 25 instead of the InGaAs epitaxial layer of the first embodiment. The electrically insulating film 25 is an $SiO_2$ insulating film or SiN insulating film. In FIG. 16, reference numeral 1 denotes a surface to be scribed, 4 denotes an InP substrate, and 5 denotes an epitaxial layer. FIG. 17 is a diagram illustrating typical shapes of cracks formed in this structure under different scribing loads.

The insulating film 25 is made of $SiO_2$ or SiN which are hard electrically insulating materials. Therefore, in order to form a crack in the semiconductor layers underlying the insulating film 25 it is necessary to apply a scribing load greater than a certain minimum to the film. For example, when the applied scribing load is within the elastic range of the insulating film 25 (of $SiO_2$ or SiN), a crack is unlikely to be formed in the semiconductor layers underlying the insulating film. If a scribing load great enough to break the insulating film 25 (of $SiO_2$ or SiN) is applied to the film, a high load is directly applied to the underlying semiconductor layers as if the insulating film 25 did not exist. The resulting crack in the InP layer may have a leading portion extending obliquely. That is, since $SiO_2$ and SiN are hard, the insulating film 25 (of $SiO_2$ or SiN) does not transmit the applied stress to the underlying semiconductor layers very well. It was found that when a certain scribing load value was exceeded, a crack abruptly appeared and propagated, as shown in FIG. 17.

In order to prevent this from happening, in accordance with the second embodiment the basic technique described in connection with the first embodiment is applied to the insulating film (of $SiO_2$ or SiN). For example, in the case of a semiconductor wafer having an insulating film of $SiO_2$ (or SiN), the portions of the wafer in which cracks are to be formed by scribing their surface with a scriber tool are constructed without $SiO_2$ (or SiN); that is, e.g., the insulating film is removed from those portions in which cracks are to be formed.

Specifically, the basic technique, structure, and manufacturing method of the first embodiment, which have been described above in connection with semiconductor wafers and semiconductor bars, etc. having an InGaAs epitaxial layer, may also be applied to semiconductor wafers and semiconductor bars having an insulating film of $SiO_2$ or SiN. It should be noted that the insulating film of $SiO_2$ or SiN of these semiconductor wafers and semiconductor bars may be located at a different layer position in the layer structure depending on the semiconductor device structure, with the layer structure including semiconductor layers, semiconductor epitaxial layers, and other insulating films, formed on a substrate. However, in any case, the insulating film should be removed from the portions of the semiconductor wafers or bars in which cracks are to be formed by scribing, thus forming openings (or underlayer-exposing portions) in the film.

Thus in accordance with the second embodiment, as in the first embodiment, it is possible to form suitable cracks in semiconductor wafers and bars by scribing their surface so as to be able to accurately split them and form cleaved faces of good quality, as well as improving productivity in various ways.

It should be noted that the features of the variations of the first embodiment described above may be suitably applied to the semiconductor wafer, the semiconductor bar, the method of manufacturing a semiconductor wafer, the method of manufacturing a semiconductor bar, and the method of manufacturing a semiconductor device in accordance with the second embodiment.

Although the second embodiment has been described with reference to semiconductor wafers and bars having an $SiO_2$ insulating film or SiN insulating film, it is to be understood that the present invention is not limited to these particular insulating films. The present invention may be applied to any insulating film which, like $SiO_2$ and SiN insulating films, has such properties that a suitable vertical crack is not formed in the underlying substrate layer when the surface of the film is scribed. Such insulating films include those having a hardness equivalent to that of the $SiO_2$ or SiN insulating film, those having a elastic range equivalent to that of the $SiO_2$ or SiN insulating film, and those having properties equivalent to those of the $SiO_2$ or SiN insulating film, in terms of preventing the transmission of scribing stress to the underlying semiconductor layers. The term "elastic range" of an insulating film as used herein refers to the range of scribing load under which the insulating film exhibits elasticity. The present invention may also be applied to such insulating films.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2011-012764, filed on Jan. 25, 2011 including specification, claims, drawings and summary, on which the Convention priority of the present application is based, are incorporated herein by reference in its entirety.

What is claimed is:

1. A semiconductor structure comprising:
    a semiconductor substrate having an edge and a surface;
    a plurality of laminated semiconductor layers disposed on the surface of the semiconductor substrate, wherein
        the plurality of laminated semiconductor layers includes an upper layer, a lower layer, and an InGaAs layer,
        the lower layer is located closer to the semiconductor substrate than is the upper layer, and
        the InGaAs layer is sandwiched between the upper layer and the lower layer;
    an array of optical semiconductor devices in the plurality of laminated semiconductor layers, wherein
    optical semiconductor devices of the array of optical semiconductor devices have resonator end faces when divided from the semiconductor substrate, and
    the semiconductor substrate is divided into bars of the optical semiconductor devices of the array of optical semiconductor devices by cleaving the semiconductor substrate along cleaving lines that separate the bars of the optical semiconductor devices of the array of optical semiconductor devices on the semiconductor substrate before the cleaving; and
    an opening in the plurality of semiconductor layers, wherein the opening
        extends into the plurality of laminated semiconductor layers, toward the surface of the semiconductor substrate, through the upper semiconductor layer and the InGaAs layer, exposing the lower layer,
        extends through the plurality of laminated semiconductor layers, parallel to the surface of the semiconductor substrate, from the edge of the semiconductor substrate along one of the cleaving lines along which the resonator end faces of the optical semiconductor devices array of optical semiconductor devices are to be formed when separated into bars by cleaving of the semiconductor substrate, and
        terminates before reaching the resonator end face of the optical semiconductor device array of optical semiconductor devices that is located along the cleaving line and closest to the edge of the semiconductor substrate from which the opening extends, parallel to the surface of the semiconductor substrate.

2. The semiconductor structure according to claim 1, wherein the semiconductor substrate is one of InP and GaAs.

3. A semiconductor structure comprising:
    a semiconductor substrate having a surface;
    a plurality of laminated semiconductor layers disposed on the surface of the semiconductor substrate, wherein
        the plurality of laminated semiconductor layers includes an upper layer, a lower layer, and an InGaAs layer,
        the lower layer is located closer to the semiconductor substrate than is the upper layer, and
        the InGaAs layer is sandwiched between the upper layer and the lower layer;
    an array of optical semiconductor devices in the plurality of laminated semiconductor layers, wherein
        optical semiconductor devices of the array of optical semiconductor devices have cleaved resonator end faces and cleaved side faces, transverse to the resonator faces, when divided from the semiconductor substrate,
        adjacent optical semiconductor devices of the array of optical semiconductor devices are separated from each other on the semiconductor substrate by side face cleaving lines along which the optical semiconductor devices of the array of optical semiconductor devices are separated from each other along side faces of the optical semiconductor devices of the array of optical semiconductor devices by cleaving of the semiconductor substrate, and
        adjacent optical semiconductor devices of the array of optical semiconductor devices are separated from each other on the semiconductor substrate by resonator end face cleaving lines along which the optical semiconductor devices of the array of optical semiconductor devices are separated from each other along resonator end faces of the optical semiconductor devices of the array of optical semiconductor devices by cleaving of the semiconductor substrate; and
    at least one opening extending into the laminated semiconductor layers and through the upper semiconductor layer and the InGaAs layer, exposing the lower layer, so that
        the InGaAs layer extends along the side face cleaving lines along which the cleaved side faces of the optical semiconductor devices of the array of optical semiconductor devices are formed by cleaving of the semiconductor substrate; and
        the InGaAs layer is present adjacent and in contact with the resonator end face cleaving lines, but not on the resonator end face cleaving lines at which the resonator end faces of the optical semiconductor devices of the array of optical semiconductor devices are formed by cleaving of the semiconductor substrate.

4. The semiconductor structure according to claim 3, wherein the semiconductor substrate is one of InP and GaAs.

5. A method of manufacturing plurality of semiconductor devices from a semiconductor structure including a semiconductor substrate and a plurality of semiconductor layers on the semiconductor substrate, the plurality of semiconductor layers including an upper layer and a lower layer, with the lower layer closer to the semiconductor substrate than the upper layer, and an InGaAs layer sandwiched by the upper layer and the lower layer, and having the plurality of semiconductor devices in the plurality of semiconductor layers, the method comprising:
    forming an opening in the plurality of semiconductor layers, extending through the upper layer and the InGaAs layer and exposing the lower layer, including forming the opening as a continuous opening extending along and between at least some of the plurality of semiconductor devices:
    scribing the lower layer of the plurality of semiconductor layers that is exposed by the opening in the InGaAs layer and thereby forming cracks in the semiconductor substrate; and
    after the scribing, cleaving the semiconductor substrate along the cracks, thereby separating the semiconductor structure along the cracks into individual chips, each chip including one of the semiconductor devices of the plurality of semiconductor devices.

6. The method of manufacturing a semiconductor device according to claim 5, further including cleaving the semiconductor substrate while the lower layer remains exposed in the opening.

7. A method of manufacturing plurality of semiconductor devices from a semiconductor structure including a semiconductor substrate and a plurality of semiconductor layers on the semiconductor substrate, the plurality of semiconductor layers including an upper layer and a lower layer, with the lower layer closer to the semiconductor substrate than the upper layer, and an InGaAs layer sandwiched by the upper layer and the lower layer, and having the plurality of semiconductor devices in the plurality of semiconductor layers, the method comprising:

forming divided separate openings, which are spaced apart and arranged along and between the plurality of semiconductor devices, in the plurality of semiconductor layers, extending through the upper layer and the InGaAs layer and exposing the lower layer;

scribing the lower layer of the plurality of semiconductor layers that is exposed by the openings in the InGaAs layer and thereby forming cracks in the semiconductor substrate; and after the scribing, cleaving the semiconductor substrate along the cracks, thereby separating the semiconductor structure along the cracks into individual chips, each chip including one of the semiconductor devices of the plurality of semiconductor devices.

8. The method of manufacturing a semiconductor device according to claim 7, further including cleaving the semiconductor substrate while the lower layer remains exposed in the openings.

* * * * *